US012494346B2

(12) United States Patent
Liu et al.

(10) Patent No.: US 12,494,346 B2
(45) Date of Patent: Dec. 9, 2025

(54) CERAMIC AIR INLET RADIO FREQUENCY CONNECTION TYPE CLEANING DEVICE

(71) Applicant: JIANGSU LEUVEN INSTRUMENTS CO. LTD, Jiangsu (CN)

(72) Inventors: Haiyang Liu, Jiangsu (CN); Dongdong Hu, Jiangsu (CN); Xuedong Li, Jiangsu (CN); Na Li, Jiangsu (CN); Shiran Cheng, Jiangsu (CN); Jun Zhang, Jiangsu (CN); Zhihao Wu, Jiangsu (CN); Kaidong Xu, Jiangsu (CN)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 926 days.

(21) Appl. No.: 17/629,362

(22) PCT Filed: Feb. 29, 2020

(86) PCT No.: PCT/CN2020/077313
§ 371 (c)(1),
(2) Date: Jan. 21, 2022

(87) PCT Pub. No.: WO2021/134891
PCT Pub. Date: Jul. 8, 2021

(65) Prior Publication Data

US 2022/0254605 A1 Aug. 11, 2022

(30) Foreign Application Priority Data

Dec. 31, 2019 (CN) ........................ 201911421168.9

(51) Int. Cl.

| | |
|---|---|
| ***H01J 37/32*** | (2006.01) |
| ***B08B 7/00*** | (2006.01) |
| ***B08B 13/00*** | (2006.01) |
| ***C23F 4/00*** | (2006.01) |

(52) U.S. Cl.
CPC ........ *H01J 37/3244* (2013.01); *B08B 7/0035* (2013.01); *B08B 13/00* (2013.01);
(Continued)

(58) Field of Classification Search
None
See application file for complete search history.

(56) References Cited

U.S. PATENT DOCUMENTS 5,542,559 A * 8/1996 Kawakami .......... H01J 37/3244 156/345.47
6,013,155 A * 1/2000 McMillin .............. C23C 16/507 216/68
(Continued)

FOREIGN PATENT DOCUMENTS

CN 101996840 3/2011
CN 108831817 11/2018
(Continued)

OTHER PUBLICATIONS

"International Search Report (Form PCT/ISA/210)" of PCT/CN2020/077313, with English translation thereof, mailed on Sep. 29, 2020, pp. 1-4.
(Continued)

*Primary Examiner* — Keath T Chen
*Assistant Examiner* — Margaret Klunk
(74) *Attorney, Agent, or Firm* — JCIPRNET

(57) ABSTRACT

Disclosed is a ceramic air inlet radio frequency connection type cleaning device, comprising an etching system, a cleaning system, a power supply control device and a radio frequency cleaning mechanism, wherein the power supply control device is connected to the etching system and the cleaning system and is used for power supply switching; the etching system is connected to two single three-dimensional coil bodies of a three-dimensional coil by means of two lines
(Continued)

of a power distribution box so as to etch a wafer in a chamber; and the cleaning system enables the lower surface of a top ceramic air inlet nozzle connected to the radio frequency cleaning mechanism to generate high negative pressure by connecting a radio frequency to the radio frequency cleaning mechanism, such that plasmas directly bombard the lower surface of the top ceramic air inlet nozzle.

7 Claims, 9 Drawing Sheets

(52) U.S. Cl.
CPC .......... *C23F 4/00* (2013.01); *H01J 37/32183* (2013.01); *H01J 37/32862* (2013.01); *H01J 2237/334* (2013.01)

(56) References Cited

U.S. PATENT DOCUMENTS

| | | | | |
|---|---|---|---|---|
| 6,024,105 | A | 2/2000 | Hanazaki et al. | |
| 2002/0047536 | A1* | 4/2002 | Ogawa | H05H 1/46 315/111.11 |
| 2003/0070620 | A1* | 4/2003 | Cooperberg | H01J 37/3244 118/723 AN |
| 2007/0256786 | A1* | 11/2007 | Zhou | H01J 37/32477 156/345.34 |
| 2009/0324847 | A1* | 12/2009 | Choi | C23C 16/4401 427/561 |
| 2022/0319817 | A1* | 10/2022 | Li | H01J 37/32651 |
| 2022/0375733 | A1* | 11/2022 | Liu | H01J 37/32862 |

FOREIGN PATENT DOCUMENTS

| | | |
|---|---|---|
| CN | 110223904 | 9/2019 |
| CN | 110491760 | 11/2019 |
| WO | 2004044971 | 5/2004 |

OTHER PUBLICATIONS

"Written Opinion of the International Searching Authority (Form PCT/ISA/237)" of PCT/CN2020/077313, mailed on Sep. 29, 2020, pp. 1-3.

* cited by examiner

CERAMIC AIR INLET RADIO FREQUENCY CONNECTION TYPE CLEANING DEVICE

CROSS-REFERENCE TO RELATED APPLICATION

This application is a 371 of international application of PCT application serial no. PCT/CN2020/077313, filed on Feb. 29, 2020, which claims the priority benefit of China application no. 201911421168.9, filed on Dec. 31, 2019. The entirety of each of the above mentioned patent applications is hereby incorporated by reference herein and made a part of this specification.

TECHNICAL FIELD

The present invention belongs to the field of semiconductor integrated circuit manufacturing, and specifically, relates to a ceramic air inlet radio frequency connection type cleaning device.

DESCRIPTION OF RELATED ART

Currently, in the process of etching some non-volatile metal materials, plasma is accelerated under bias pressure to reach the surface of the metal material, and metal particles sputtered from the surface of the etched material adhere to all exposed surfaces within a chamber, including an inner wall of the chamber, a coupling window at the top of the chamber, and a top ceramic air inlet portion, causing contamination. In order to resolve the problem of contamination, it is necessary to inject a cleaning gas into the chamber, and load radio frequency power at the top to ionize the cleaning gas, to remove these contaminated particles. The chamber is grounded during the entire cleaning process, and the top ceramic air inlet portion is made of an insulation material. Therefore, radio frequency power is loaded by radio frequency at the top during cleaning to excite plasma, and the active plasma cleans the grounded chamber, but almost has no cleaning effect for the top ceramic air inlet portion. Pollutant superposition becomes more severe over time and a case in which sediments fall off and contaminate the wafer occurs.

Currently, the existing solution is to replace the top ceramic air inlet portion periodically. This solution resolves to some extent the problem of wafer contamination caused by sediments falling off the top ceramic air inlet portion due to pollutant superposition. However, the vacuum needs to be broken for each replacement, which is time-consuming and labor-intensive. In addition, a replacement cycle cannot be accurately determined, which inevitably causes damage to the wafer directly below, resulting in irreversible and serious consequences. Therefore, there is a need to design a method and device that can completely clean the top ceramic air inlet portion.

SUMMARY

The present invention provides a ceramic air inlet radio frequency connection type cleaning device, which resolves a problem that a contaminated region on a lower surface of a ceramic air inlet nozzle cannot be cleaned during cleaning of a chamber.

The technical problem of the present invention is resolved by using the following technical solution: a ceramic air inlet radio frequency connection type cleaning device, including a wafer provided in a middle of a chamber, a coupling window provided on a top of the chamber, a top ceramic air inlet nozzle located in a central region of the coupling window, and a three-dimensional coil placed above the coupling window, where the three-dimensional coil includes two single three-dimensional coil bodies which are independent mutually at center and edge, and the two single three-dimensional coil bodies each have one end connected together to radio frequency and another end connected together and grounded; and including an etching system, a cleaning system, a power supply control device, and a radio frequency cleaning mechanism, where:

the power supply control device is connected to the etching system and the cleaning system and is used for power supply switching; the device includes a power distribution box, and the etching system is connected to the two single three-dimensional coil bodies of the three-dimensional coil by means of two circuits of the power distribution box so as to etch the wafer in the chamber; and the cleaning system enables a lower surface of the top ceramic air inlet nozzle connected to the radio frequency cleaning mechanism to generate high negative pressure by connecting the radio frequency to the radio frequency cleaning mechanism, such that plasma directly bombards the lower surface of the top ceramic air inlet nozzle.

Preferably, the power supply control device includes a first radio frequency power supply, a radio frequency matcher, and a first RF switching box connected in sequence, and switching between the etching system and the cleaning system is achieved by means of the first RF switching box.

Preferably, the power supply control device includes a second radio frequency power supply, a second RF switching box, a first coil radio frequency matcher connected to the etching system, and a center radio frequency matcher connected to the cleaning system, where an output terminal of the second radio frequency power supply is connected to the second RF switching box, and switching between the first coil radio frequency matcher and the center radio frequency matcher is achieved by means of the second RF switching box.

Preferably, the power supply control device includes a coil radio frequency power supply, a center radio frequency power supply, a second coil radio frequency matcher, and a center radio frequency matcher, where an output terminal of the coil radio frequency power supply is connected to the second coil radio frequency matcher, and an output terminal of the second coil radio frequency matcher is connected to the etching system; and an output terminal of the center radio frequency power supply is connected to the center radio frequency matcher, and an output terminal of the center radio frequency matcher is connected to the cleaning system.

Preferably, the radio frequency cleaning mechanism includes a center air inlet joint portion, an edge insulated air inlet portion, a center radio frequency air inlet portion, a center insulated air inlet portion, and a top ceramic air inlet portion connected in sequence, where:

- the center air inlet joint portion, the edge insulated air inlet portion, and the center radio frequency air inlet portion each have a communicating central gas passage, and a length of the edge insulated air inlet portion is greater than or equal to 5 mm; and
- the center air inlet joint portion is grounded and passable for a cleaning gas, and the center radio frequency air inlet portion is connected to the radio frequency; and
- the radio frequency cleaning mechanism includes a plurality of capillary tubes and a plurality of narrow gas passages, the plurality of capillary tubes are provided in the central gas passage of the edge insulated air inlet portion, the plurality of narrow gas passages are uniformly distributed on an edge of the center insulated air inlet portion and communicate with the central air inlet passage of the center radio frequency air inlet portion, and a cross-sectional area of each capillary tubes and each narrow gas passage is 0.05 $mm^2$ to 3 $mm^2$; and the center insulated air inlet portion is located inside the top ceramic air inlet portion, and the top of the center insulated air inlet portion extends into an air inlet passage of the center radio frequency air inlet portion with an extension length greater than or equal to 2 mm.

Preferably, the center air inlet joint portion and the edge insulated air inlet portion are coaxial, the center radio frequency air inlet portion, the center insulated air inlet portion, and the top ceramic air inlet portion are coaxial, and the edge insulated air inlet portion is perpendicular to the center radio frequency air inlet portion.

Preferably, the device further includes an adjustment member, where the adjustment member is of a ring structure and provided between the center insulated air inlet portion and the top ceramic air inlet portion, and a radial width of a part that is of the center insulated air inlet portion at a top end thereof and that extends into the air inlet passage of the center radio frequency air inlet portion is smaller than a tube diameter of the air inlet passage of the center radio frequency air inlet portion.

Preferably, the center air inlet joint portion is perpendicular to the edge insulated air inlet portion, and the edge insulated air inlet portion, the center radio frequency air inlet portion, the center insulated air inlet portion, and the top ceramic air inlet portion are coaxial.

Preferably, the plurality of capillary tubes provided in the central air inlet passage of the edge insulated air inlet portion extend to the bottom of the center radio frequency air inlet portion, and the center air inlet joint portion, the edge insulated air inlet portion, the center radio frequency air inlet portion, the center insulated air inlet portion, and the top ceramic air inlet portion are coaxial.

Preferably, the device further includes sealing rings, where a sealing ring is provided between the center air inlet joint portion and the edge insulated air inlet portion, a sealing ring is provided between the center radio frequency air inlet portion and the top ceramic air inlet portion, and a sealing ring is provided at a lower end of the top ceramic air inlet portion.

With the foregoing technical solutions, compared with the prior art, the present invention has the following beneficial effects:

1. In the present invention, the lower surface of the top ceramic air inlet nozzle connected to the radio frequency cleaning mechanism is enabled to generate high negative pressure by connecting the radio frequency to the center radio frequency air inlet portion in the radio frequency cleaning mechanism, such that plasma directly bombards the lower surface of the top ceramic air inlet nozzle to completely clean a contaminated region on the lower surface of the top ceramic air inlet nozzle.

2. The present invention provides various implementations and implementation methods, which effectively achieves cleaning of the contaminated region on the lower surface of the top ceramic air inlet nozzle during cleaning of the chamber, thereby avoiding periodic replacement of the top ceramic air inlet nozzle, and resolving the problem of damage to the wafer caused by sediments falling off the lower surface of the top ceramic air inlet nozzle due to pollutant superposition.

BRIEF DESCRIPTION OF THE DRAWINGS

The following further describes the present invention with reference to the accompanying drawings and embodiments.

Figure 1:
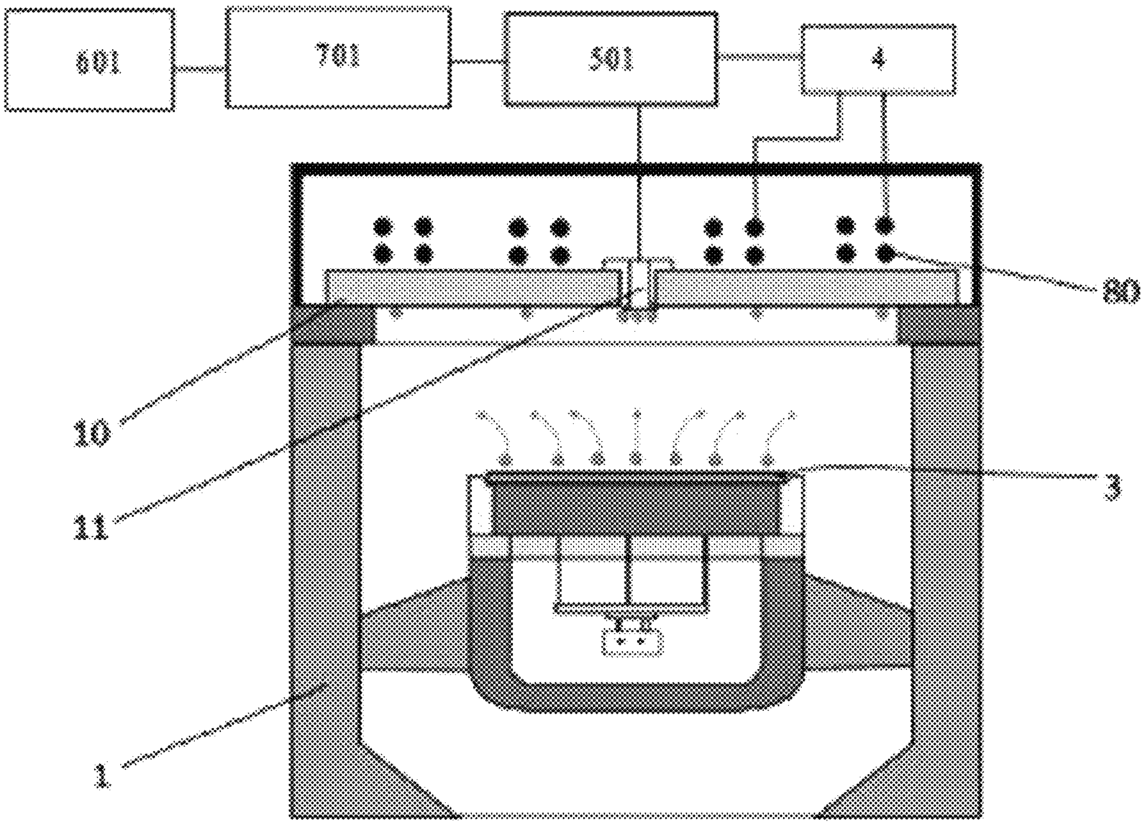
FIG. 1 is a schematic diagram of a power supply control device according to Embodiment 1 of the present invention.

In the figures: 1. chamber; 201. center air inlet joint portion; 202. edge insulated air inlet portion; 2021. capillary tube; 203. center radio frequency air inlet portion; 204. center insulated air inlet portion; 2041. narrow gas passage; 205. top ceramic air inlet portion; 206. adjustment member; 207. sealing ring; 3. wafer; 4. power distribution box; 501. first radio frequency (RF) switching box; 502. second RF switching box; 601. first radio frequency power supply; 602. second radio frequency power supply; 603. coil radio frequency power supply; 604. center radio frequency power supply; 701. radio frequency matcher; 702. first coil radio frequency matcher; 703. second coil radio frequency matcher; 704. center radio frequency matcher; 10. coupling window; 11. top ceramic air inlet nozzle; 80. three-dimensional coil.

DESCRIPTION OF THE EMBODIMENTS

The present invention is now described in further detail with reference to the accompanying drawings. These accompanying drawings are all simplified schematic diagrams, which merely illustrate the basic structure of the present invention schematically, and therefore, they show only the composition related to the present invention.

Currently, in the semiconductor integrated circuit manufacturing process, etching is one of the most important processes, and plasma etching is one of the commonly used etch methods. Etching usually occurs in a vacuum reaction chamber 1, and radio frequency is applied to form plasma of the introduced reaction gas in the processing chamber 1 to process a wafer 3. After long-term processing, sputtered metal particles adhere to an inner wall of the chamber 1, a coupling window 10 at the top of the chamber 1, and a top ceramic air inlet nozzle 11, causing contamination. In order to resolve the problem of contamination, it is necessary to inject a cleaning gas into the chamber 1, and load radio frequency power at the top to ionize the cleaning gas, to remove these contaminated particles. The chamber 1 is grounded during the entire cleaning process, and the top ceramic air inlet nozzle 11 is made of an insulation material. Therefore, the radio frequency power is loaded by the radio frequency at the top during cleaning to excite plasma, and the active plasma cleans the grounded chamber 1, but almost has no cleaning effect for the top ceramic air inlet nozzle 11. Pollutant superposition becomes more severe over time and a case in which sediments fall off and contaminate the wafer 3 occurs.

The prior art is to replace the top ceramic air inlet nozzle 11 periodically. This solution resolves to some extent the problem of contamination of the wafer 3 caused by sediments falling off the top ceramic air inlet nozzle 11 due to pollutant superposition. However, the solution is time-consuming and labor-intensive. In addition, a replacement cycle cannot be accurately determined, which inevitably causes damage to the wafer directly below, resulting in irreversible and serious consequences. Therefore, a ceramic air inlet radio frequency connection type cleaning device is designed, which can completely clean a contaminated region on a lower surface of the top ceramic air inlet nozzle 11.

The technical solution of the present invention is specifically a ceramic air inlet radio frequency connection type cleaning device. A wafer 3 is provided in the middle of a chamber 1, a coupling window 10 is provided above the chamber 1, a top ceramic air inlet nozzle 11 is provided in a central region of the coupling window 10, a three-dimensional coil 80 is placed in an upper part of the coupling window 10, the three-dimensional coil 80 includes two single three-dimensional coil bodies which are independent mutually at center and edge, and the two single three-dimensional coil bodies each have one end connected together to radio frequency and the other end connected together and grounded.

In order to resolve the problem that a contaminated region on a lower surface of the top ceramic air inlet nozzle 11 cannot be cleaned during a cleaning process, an etching system, a cleaning system, a power supply control device, and a radio frequency cleaning mechanism are configured in the present invention, where:

the power supply control device is connected to the etching system and the cleaning system and is used for power supply switching;

the etching system is connected to the two single three-dimensional coil bodies of the three-dimensional coil 80 by means of two lines of a power distribution box 4 so as to etch the wafer 3 in the chamber 1; and the cleaning system enables a lower surface of the top ceramic air inlet nozzle 11 connected to the radio frequency cleaning mechanism to generate high negative pressure by connecting the radio frequency to the radio frequency cleaning mechanism, such that plasma directly bombards the lower surface of the top ceramic air inlet nozzle 11. Specific implementations of the plasma processing system and cleaning method involved in the present invention are as follows:

Embodiment 1

As shown in FIG. 1, the power supply control device includes a first radio frequency power supply 601, a radio frequency matcher 701, and a first radio frequency (RF) switching box 501. The first radio frequency power supply 601 supplies power and has an output terminal connected to an input terminal of the radio frequency matcher 701. The output terminal of the radio frequency matcher 701 is connected to the first RF switching box 501. The first RF switching box 501 has two output terminals, one output terminal is connected to the radio frequency cleaning mechanism, and the other output terminal is connected to the power distribution box 4. Two output terminals of the power distribution box 4 are respectively connected to the two mutually independent single three-dimensional coil bodies at the center and edge of the three-dimensional coil 80. The two mutually independent single three-dimensional coil bodies at the center and edge of the three-dimensional coil 80 each have one end connected together to an external radio frequency device, and the other end also connected together to the ground. Non-grounded ends of inner and outer coils are both connected to the power distribution box 4 of the radio frequency matcher 701. The power distribution box 4 sets power to be distributed to the center and the edge, to adjust the power of the center and the edge according to different process requirements, so as to adjust density of plasma in the chamber 1.

Figure 2:
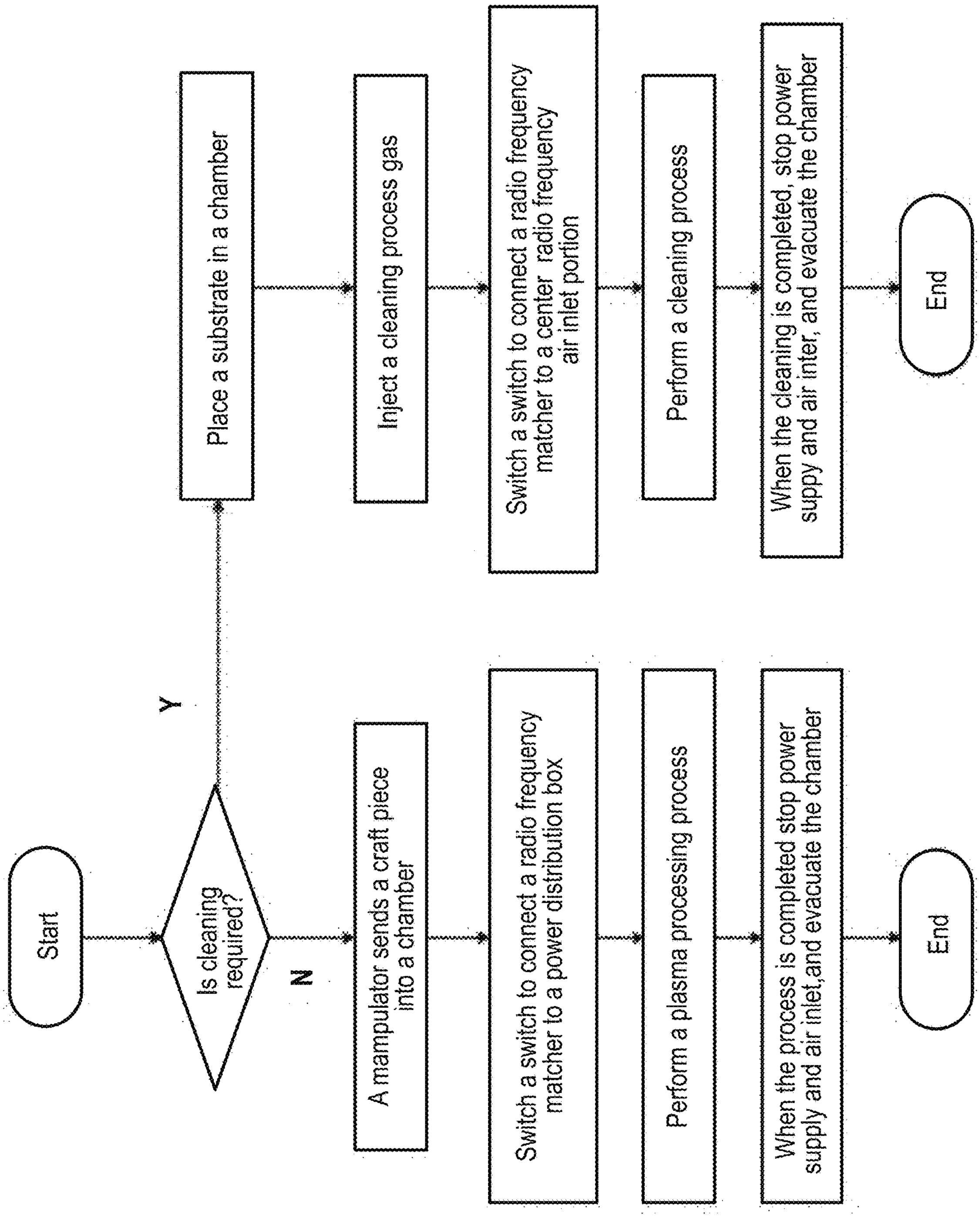
FIG. 2 is a schematic diagram of a processing system and a cleaning method according to Embodiment 1 of the present invention.

As shown in FIG. 2, when the device is ready for the process, it is first determined whether to perform a cleaning method. If the cleaning method is not to be performed, an etching process is to be performed, and the etching system starts to operate. A manipulator sends a craft piece (the wafer 3) into the chamber 1. A reaction gas is injected into the chamber 1. The first RF switching box 501 loads all output power of the radio frequency matcher 701 into the power distribution box 4. There is no power on the radio frequency cleaning mechanism. The power distribution box 4 then distributes power to the coils at the center and the edge as required. The loaded radio frequency power ionizes the reaction gas, and generated plasma etches the wafer 3 in the chamber 1. After the etching is completed, power output and air intake are stopped, and then the chamber 1 is evacuated.

When the process is completed and a method for cleaning the chamber 1 is started, a substrate sheet is placed in the chamber 1. The substrate sheet is a discarded sheet, provided to prevent contaminants from falling off and damaging the device below during the cleaning process. A cleaning gas is injected through the top ceramic air inlet nozzle 11. The first RF switching box 501 loads all power to the radio frequency cleaning mechanism, and power of each of the inner coil and the outer coil is zero. The loaded radio frequency power ionizes the cleaning gas. Plasma generated in this case cleans the interior of the chamber 1, and completely clean the lower surface of the top ceramic air inlet nozzle 11, thereby reducing deposition of non-volatile metal particles on the lower surface of the top ceramic air inlet nozzle 11. After the cleaning is completed, power output and air intake are stopped, and the chamber 1 is evacuated.

Embodiment 2

Figure 3:
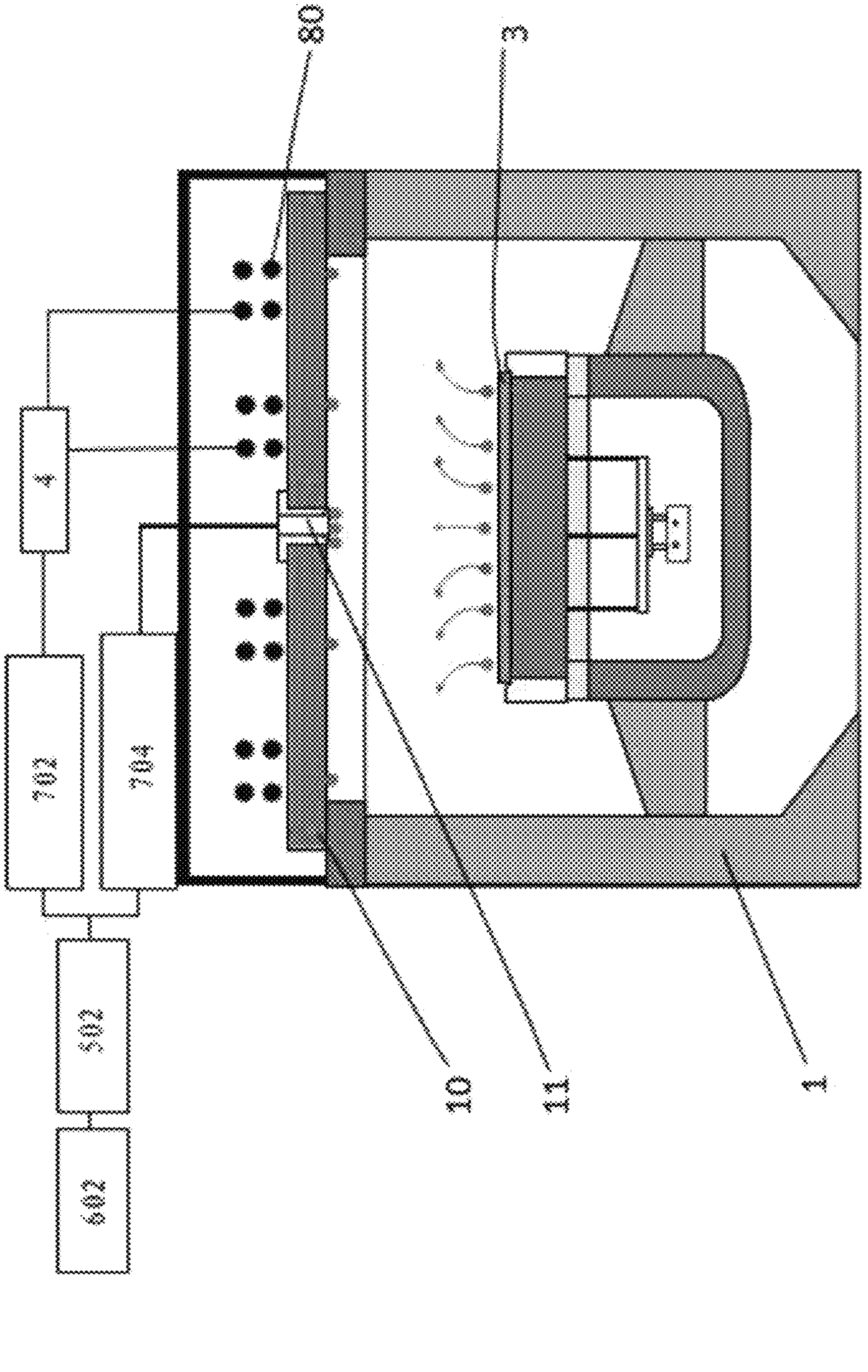
FIG. 3 is a schematic diagram of a power supply control device according to Embodiment 2 of the present invention.

As shown in FIG. 3, the power supply control device includes a second radio frequency power supply 602, a second RF switching box 502, a first coil radio frequency matcher 702 connected to the etching system, and a center radio frequency matcher 704 connected to the cleaning system. An output terminal of the second radio frequency power supply 602 is connected to the second RF switching box 502. Switching between the first coil radio frequency matcher 702 and the center radio frequency matcher 704 is achieved by means of the second RF switching box 502.

In other words, two radio frequency matchers are configured in this embodiment, one matcher is the center radio frequency matcher 704 for loading radio frequency power to the radio frequency cleaning mechanism, and the other is the first coil radio frequency matcher 702 for loading radio frequency power to the inner and outer coils. In addition, the two radio frequency matchers are both controlled by the second radio frequency power supply 602, and the second RF switching box 502 is used between the second radio frequency power supply 602 and the radio frequency matcher to control which radio frequency matcher starts working.

Figure 4:
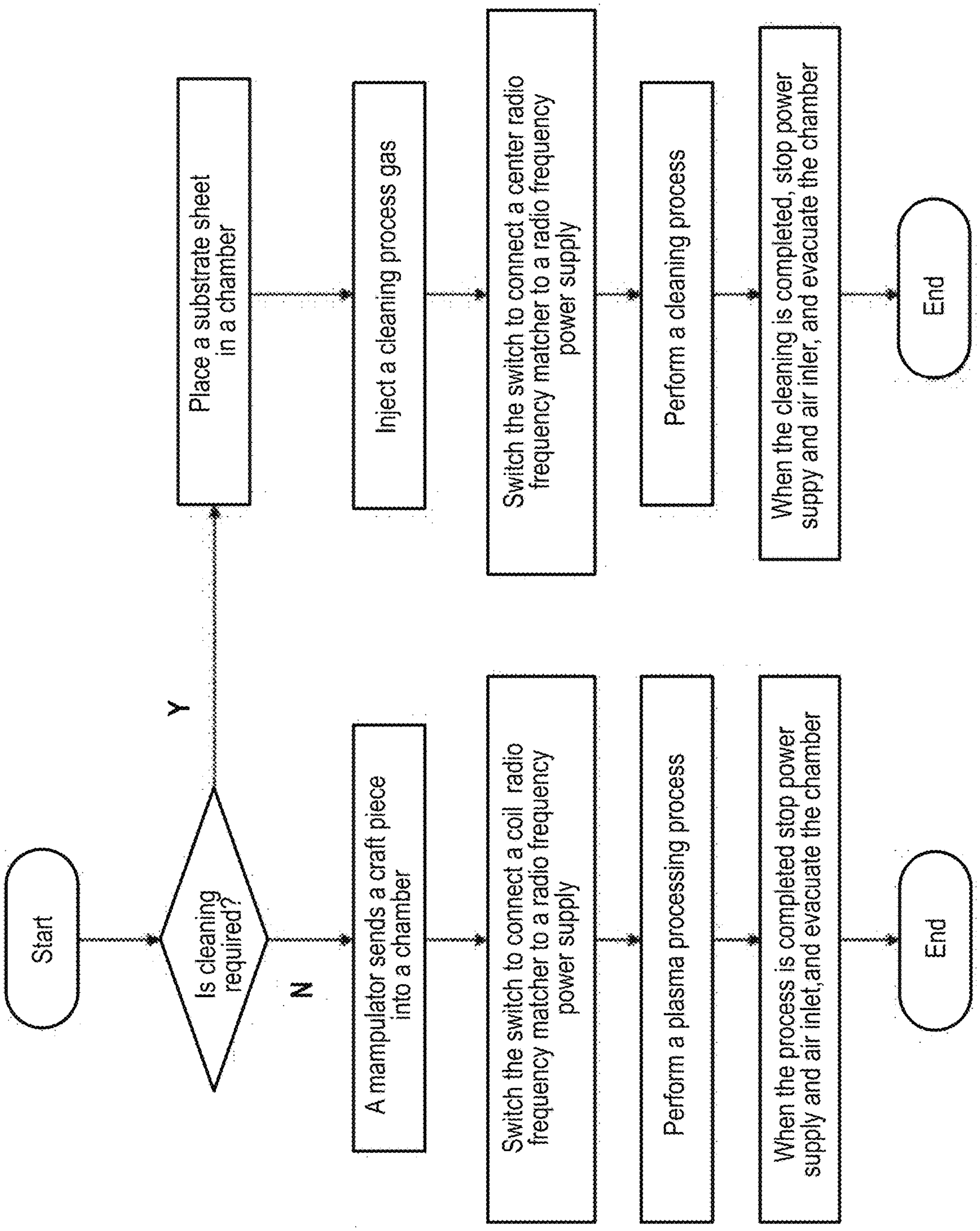
FIG. 4 is a schematic diagram of a processing system and a cleaning method according to Embodiment 2 of the present invention.

As shown in FIG. 4, when the device is ready for the process, it is first determined whether to perform a cleaning method. If the cleaning method is not to be performed, an etching process is to be performed, and the etching system starts to operate. A manipulator sends a craft piece (the wafer 3) into the chamber 1. A reaction gas is injected into the chamber 1. The second RF switching box 502 connects the second radio frequency power supply 602 to the first coil radio frequency matcher 702, and the center radio frequency matcher 704 is not powered on. Power from the first coil radio frequency matcher 702 is loaded into the coils at the center and edge through the power distribution box 4. The loaded radio frequency power ionizes the reaction gas, and generated plasma etches the wafer 3 in the chamber 1. After the etching is completed, power output and air intake are stopped, and then the chamber 1 is evacuated.

When the process is completed and a method for cleaning the chamber 1 is started, a substrate sheet is placed in the chamber 1. The substrate sheet is a discarded sheet, provided to prevent contaminants from falling off and damaging the device below during the cleaning process. A cleaning gas is injected through the top ceramic air inlet nozzle 11. The second RF switching box 502 connects the second radio frequency power supply 602 to the center radio frequency matcher 704, and the first coil radio frequency matcher 702 is not powered on. All power from the center radio frequency matcher 704 is loaded to the radio frequency cleaning mechanism. The loaded radio frequency power ionizes the cleaning gas, and plasma generated in this case cleans the interior of the chamber 1 and completely cleans the lower surface of the top ceramic air inlet nozzle 11, thereby reducing deposition of non-volatile metal particles on the lower surface of the top ceramic air inlet nozzle 11. After the cleaning is completed, power output and air intake are stopped, and then the chamber 1 is evacuated.

Embodiment 3

Figure 5:
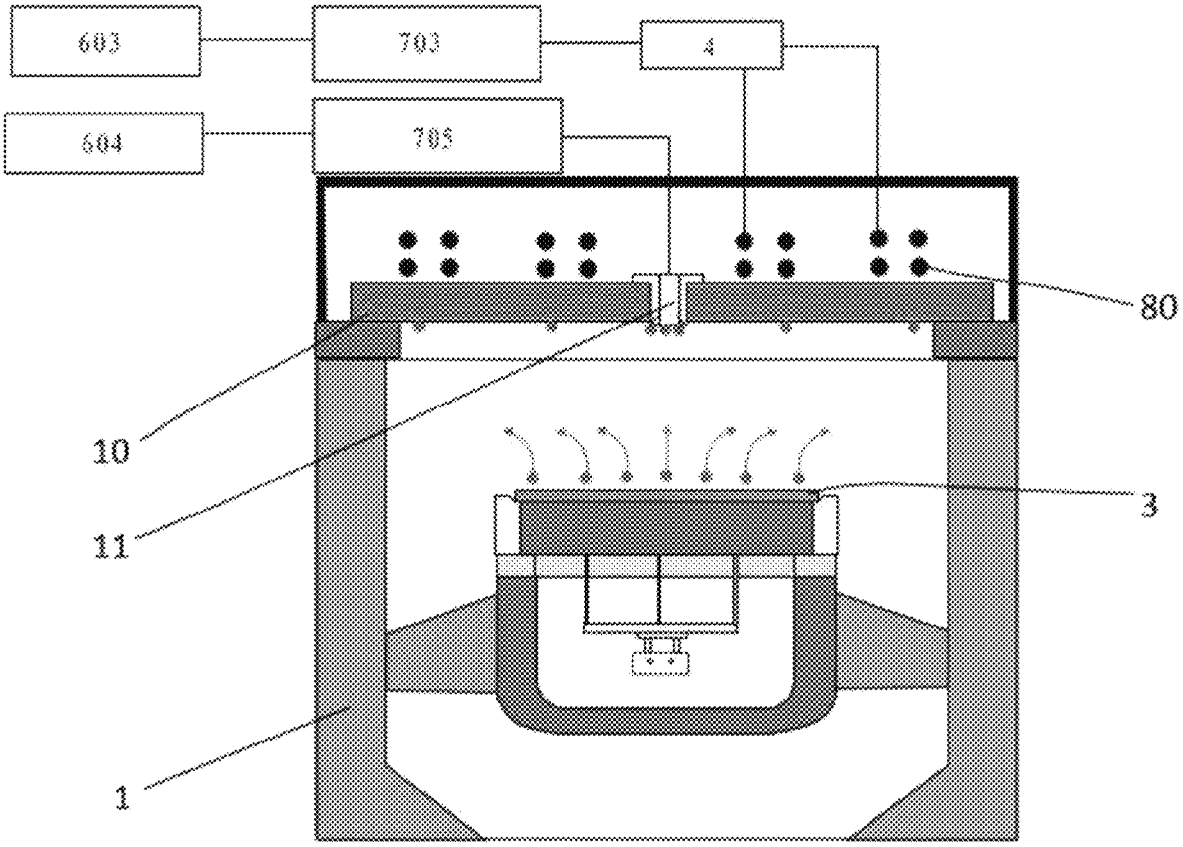
FIG. 5 is a schematic diagram of a power supply control device according to Embodiment 3 of the present invention.

As shown in FIG. 5, the power supply control device includes a coil radio frequency power supply 603, a center radio frequency power supply 604, a second coil radio frequency matcher 703, and a center radio frequency matcher 705. An output terminal of the coil radio frequency power supply 603 is connected to the second coil radio frequency matcher 703. An output terminal of the second coil radio frequency matcher 703 is connected to the etching system. An output terminal of the center radio frequency power supply 604 is connected to the center radio frequency matcher 705. An output terminal of the center radio frequency matcher 705 is connected to the cleaning system.

In other words, two radio frequency power supplies and two matchers are configured in this embodiment, one pair of radio frequency power supply and radio frequency matcher for the inner and outer coils alone, and the other pair of radio frequency power supply and radio frequency matcher for the radio frequency cleaning mechanism alone, and the two pairs do not interfere with each other.

Figure 6:
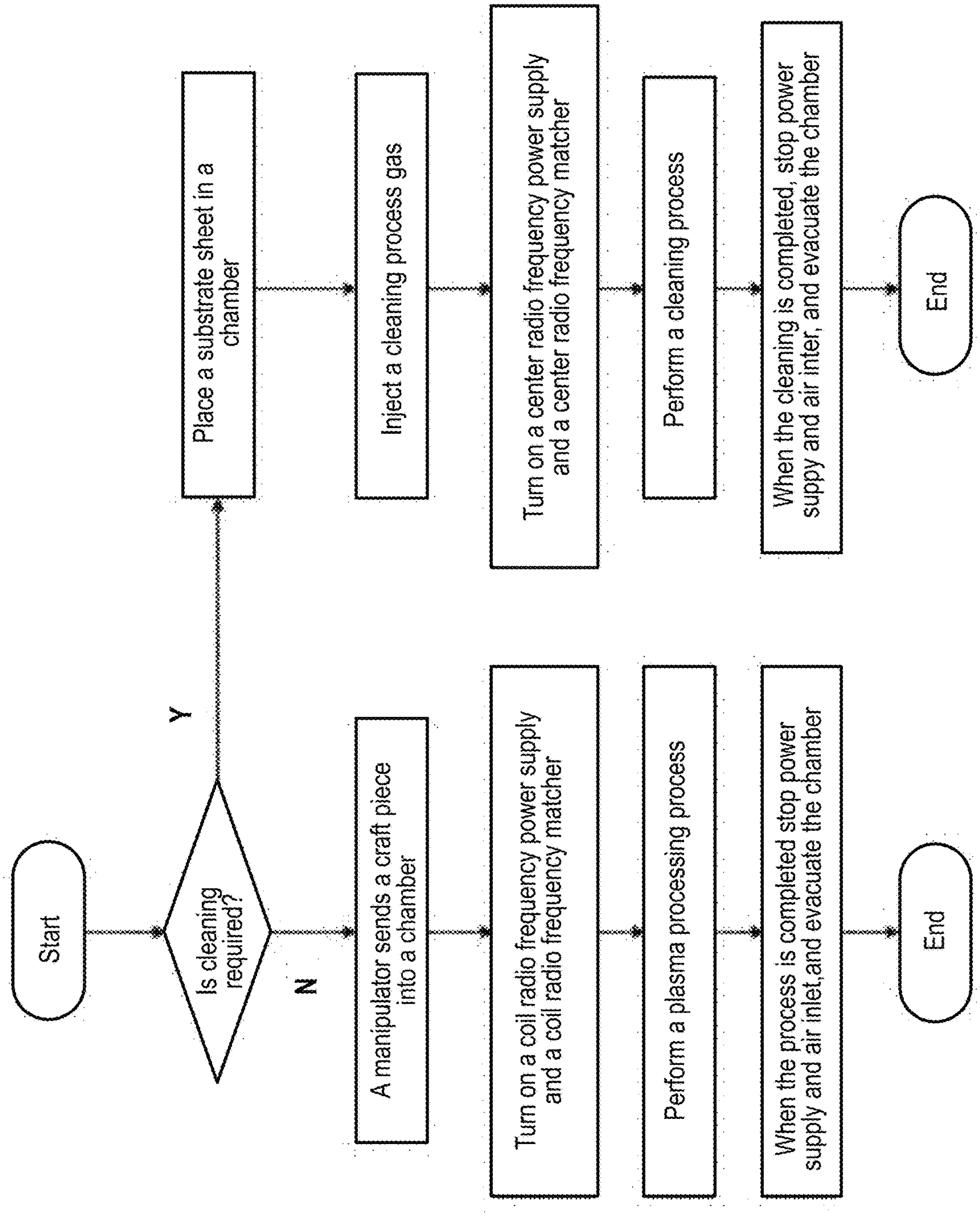
FIG. 6 is a schematic diagram of a processing system and a cleaning method according to Embodiment 3 of the present invention.

As shown in FIG. 6, when the device is ready for the process, it is first determined whether to perform a cleaning method. If the cleaning method is not to be performed, an etching process is to be performed, and the etching system starts to operate. A manipulator sends a craft piece (the wafer 3) into the chamber 1. A reaction gas is injected into the chamber 1. The coil radio frequency power supply 603 is turned on. The center radio frequency power supply 604 is turned off. The second coil radio frequency matcher 703 loads radio frequency power into the coils at the center and the edge of the three-dimensional coil 80 through the power distribution box 4. The loaded radio frequency power ionizes the reaction gas, and generated plasma etches the wafer 3 in the chamber 1. After the etching is completed, power output and air intake are stopped, and then the chamber 1 is evacuated.

When the process is completed and a method for cleaning the chamber 1 is started, a substrate sheet is placed in the chamber 1. The substrate sheet is a discarded sheet, provided to prevent contaminants from falling off and damaging the device below during the cleaning process. A cleaning gas is injected through the top ceramic air inlet nozzle 11. The coil radio frequency power supply 603 is turned off. The center radio frequency power supply 604 is turned on. All power from the center radio frequency matcher 705 is loaded to the radio frequency cleaning mechanism. The loaded radio frequency power ionizes the cleaning gas, and plasma generated in this case cleans the interior of the chamber 1 and completely cleans the lower surface of the top ceramic air inlet nozzle 11, thereby reducing deposition of non-volatile metal particles on the lower surface of the top ceramic air inlet nozzle 11. After the cleaning is completed, power output and air intake are stopped, and then the chamber 1 is evacuated.

For the specific structures described in the foregoing embodiments, several implementations are specifically described as follows:

The present invention the radio frequency cleaning mechanism includes a center air inlet joint portion 201, an edge insulated air inlet portion 202, a center radio frequency air inlet portion 203, a center insulated air inlet portion 204, and a top ceramic air inlet portion 205 connected in sequence. The center air inlet joint portion 201, the edge insulated air inlet portion 202, and the center radio frequency air inlet portion 203 each have a communicating gas passage in the middle. The center air inlet joint portion 201 is grounded and passable for a cleaning gas. The center radio frequency air inlet portion 203 is connected to the radio frequency.

Embodiment 4

Figure 7:
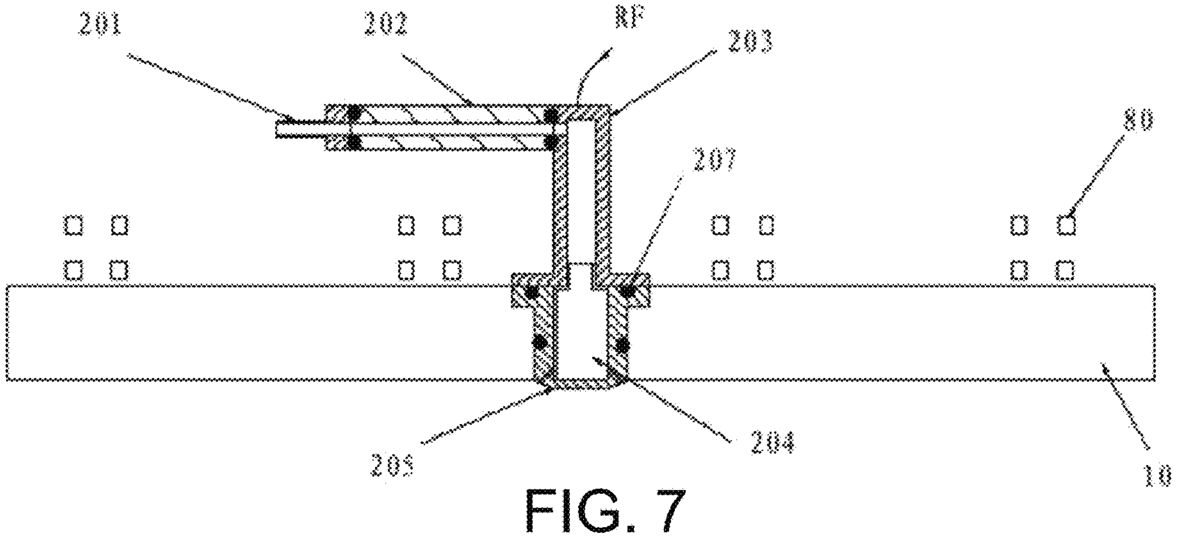
FIG. 7 is a schematic structural diagram of a radio frequency cleaning mechanism according to Embodiment 4 of the present invention.

As shown in FIG. 7, in this embodiment, the center air inlet joint portion 201 and the edge insulated air inlet portion 202 are coaxial, the center radio frequency air inlet portion 203, the center insulated air inlet portion 204, and the top ceramic air inlet portion 205 are coaxial, and the edge insulated air inlet portion 202 is perpendicular to the center radio frequency air inlet portion 203. A length of the edge insulated air inlet portion 202 is greater than or equal to 5 mm. A radial width of a part that is of the center insulated air inlet portion 204 at a top end thereof and that extends into the air inlet passage of the center radio frequency air inlet portion 203 is consistent with a tube diameter of the air inlet passage of the center radio frequency air inlet portion 203.

The top of the center radio frequency air inlet portion 203 is connected to the radio frequency (RF). The bottom of the center radio frequency air inlet portion 203 is sealed to the top ceramic air inlet portion 205. The center radio frequency air inlet portion 203 is preferably made of aluminum, and aluminum has favorable electrical conductivity and machining properties. The central gas passage region of the center radio frequency air inlet portion 203 and all regions in contact with the vacuum are treated with hard anodized surface treatment. This ensures that the radio frequency power can be little lost, with almost no particles generated at the same time.

Figure 12:
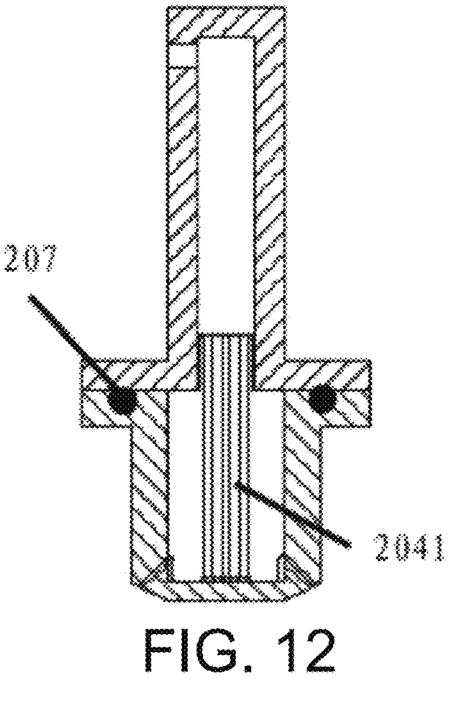
FIG. 12 is a cross-sectional view a of a narrow gas passage according to the present invention.
Figure 13:
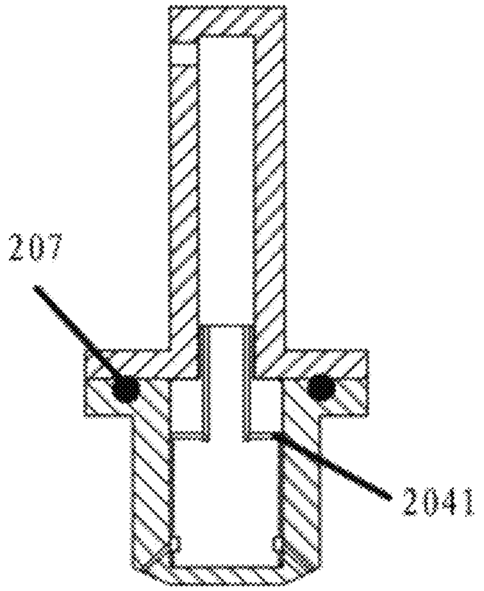
FIG. 13 is a cross-sectional view b of a narrow gas passage according to the present invention.

In order to prevent the center radio frequency air inlet portion 203 from igniting between the bottom thereof and the top ceramic air inlet portion 205, instead of inside the chamber 1, causing structural damage to the top ceramic air inlet nozzle 11, generating a large amount of particle contamination, or even damaging the wafer 3, it is necessary to fill an excess space with the center insulated air inlet portion 204 between the bottom of the center radio frequency air inlet portion 203 and the top ceramic air inlet portion 205. The center insulated air inlet portion 204 is made of ceramic or plastic (SP-1, PEI, PTFE, and other clean insulation materials), with narrow gas passages 2041 uniformly distributed at the edges thereof (as shown in FIG. 12 and FIG. 13). A cross-sectional area of each of the narrow gas passages 2041 falls in a range of 0.05 $mm^2$ to 5 $mm^2$.

The center insulated air inlet portion 204 is located inside the top ceramic air inlet portion 205. The top of the center insulated air inlet portion 204 extends into an air inlet passage of the center radio frequency air inlet portion 203 with a length of the extension portion greater than or equal to 2 mm. Because the central gas passage of the center radio frequency air inlet portion 203 is equipotential, there is no possibility of ignition. In addition, because the bottom of the center radio frequency air inlet portion 203 is non-equipotential with the gas below, as designed in this structure, a bottom space of the center radio frequency air inlet portion 203 is compressed to prevent radio frequency from forming an enough space at the bottom of the center radio frequency air inlet portion 203 to allow sufficient electron movement for ignition.

Because the center radio frequency air inlet portion 203 is connected to the radio frequency, the center air inlet joint portion 201 is grounded. In order to prevent ignition between the center radio frequency air inlet portion 203 and the center air inlet joint portion 201, it is necessary to add the edge insulated air inlet portion 202 between the two, and the edge insulated air inlet portion 202 is preferably made of ceramic, SP-1, or PEI. In the design, no particles are generated, and insulation is achieved without air intake. In addition, in order to prevent ignition inside the edge insulated air inlet portion 202 during the etching process, a plurality of capillary tubes 2021 need to be provided in the central gas passage of the edge insulated air inlet portion 202. The plurality of capillary tubes 2021 communicate with the central air inlet passage of the center radio frequency air inlet portion 203. A cross-sectional area of each of the capillary tubes 2021 falls in a range of 0.05 $mm^2$ to 3 $mm^2$. The capillary tube 2021 is preferably made of SP-1, PEI, PTFE, and other clean insulation materials. In the design of the structure of the capillary tube 2021, an air inlet space in the middle of the edge insulated air inlet portion 202 is compressed to prevent the radio frequency from forming an enough space between the center radio frequency air inlet portion 203 and the center air inlet joint portion 201 to allow sufficient electron movement for ignition.

Embodiment 5

Figure 8:
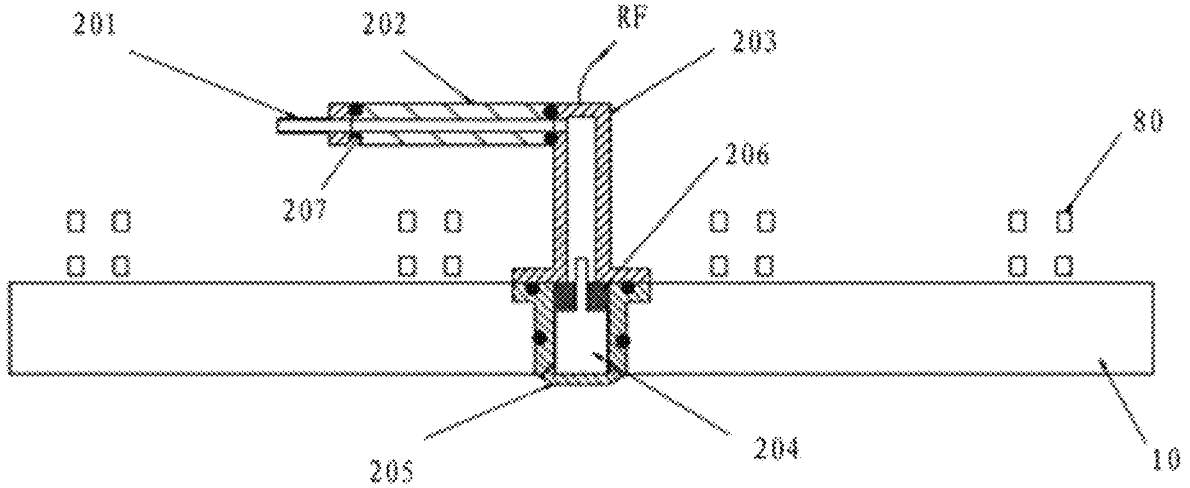
FIG. 8 is a schematic structural diagram of a radio frequency cleaning mechanism according to Embodiment 5 of the present invention.

As shown in FIG. 8, in this embodiment, the center air inlet joint portion 201 and the edge insulated air inlet portion 202 are coaxial, the center radio frequency air inlet portion 203, the center insulated air inlet portion 204, and the top ceramic air inlet portion 205 are coaxial, the edge insulated air inlet portion 202 is perpendicular to the center radio frequency air inlet portion 203, and a length of the edge insulated air inlet portion 202 is greater than or equal to 5 mm. In this embodiment, an adjustment member 206 is provided between the center insulated air inlet portion 204 and the top ceramic air inlet portion 205. The adjustment member 206 is of a ring structure. A radial width of a part that is of the center insulated air inlet portion 204 at a top end thereof and that extends into the air inlet passage of the center radio frequency air inlet portion 203 is smaller than a tube diameter of the air inlet passage of the center radio frequency air inlet portion 203.

The top of the center radio frequency air inlet portion 203 is connected to the radio frequency (RF). The bottom of the center radio frequency air inlet portion 203 is sealed to the top ceramic air inlet portion 205. The center radio frequency air inlet portion 203 and the adjustment member 206 are each preferably made of aluminum, and aluminum has favorable electrical conductivity and machining properties. The central gas passage region of the center radio frequency air inlet portion 203, all regions in contact with the vacuum, and a surface of the adjustment member 206 are treated with hard anodized surface treatment. This ensures that the radio frequency power can be little lost, with almost no particles generated at the same time.

In order to prevent the center radio frequency air inlet portion 203 from igniting between the bottom thereof and the top ceramic air inlet portion 205, instead of inside the chamber 1, causing structural damage to the top ceramic air inlet nozzle 11, generating a large amount of particle contamination, or even damaging the wafer 3, it is necessary to fill an excess space with the center insulated air inlet portion 204 between the bottom of the center radio frequency air inlet portion 203 and the top ceramic air inlet portion 205. The center insulated air inlet portion 204 is made of ceramic or plastic (SP-1, PEI, TFE, and other clean insulation materials), with narrow gas passages 2041 uniformly distributed at the edges thereof (as shown in FIG. 12 and FIG. 13). A cross-sectional area of each of the narrow gas passages 2041 falls in a range of 0.05 $mm^2$ to 5 $mm^2$. This design of the structure further expands an area that is of the lower surface of the top ceramic air inlet portion 205 and that is connected to the radio frequency access, such that the top ceramic air inlet nozzle 11 has no dead corners during cleaning, thereby completely cleaning the top ceramic air inlet nozzle 11.

The center insulated air inlet portion 204 is located inside the top ceramic air inlet portion 205. The top of the center insulated air inlet portion 204 extends into an air inlet passage of the center radio frequency air inlet portion 203 with a length of the extension portion greater than or equal to 2 mm. Because the central gas passage of the center radio frequency air inlet portion 203 is equipotential, there is no possibility of ignition. In addition, because the bottom of the center radio frequency air inlet portion 203 is non-equipotential with the gas below, as designed in this structure, a bottom space of the center radio frequency air inlet portion 203 is compressed to prevent radio frequency from forming an enough space at the bottom of the center radio frequency air inlet portion 203 to allow sufficient electron movement for ignition.

Because the center radio frequency air inlet portion 203 is connected to the radio frequency, the center air inlet joint portion 201 is grounded. In order to prevent ignition between the center radio frequency air inlet portion 203 and the center air inlet joint portion 201, it is necessary to add the edge insulated air inlet portion 202 between the two, and the edge insulated air inlet portion 202 is preferably made of ceramic, SP-1, PEI, PTFE, and other clean insulation materials. In the design, no particles are generated, and insulation is achieved without air intake. In addition, in order to prevent ignition inside the edge insulated air inlet portion 202 during the etching process, a plurality of capillary tubes 2021 need to be provided in the central gas passage of the edge insulated air inlet portion 202. The plurality of capillary tubes 2021 communicate with the central air inlet passage of the center radio frequency air inlet portion 203. A cross-sectional area of each of the capillary tubes 2021 falls in a range of 0.05 $mm^2$ to 3 $mm^2$, and preferably, 0.15 $mm^2$ to 0.8 $mm^2$ in the present invention. The capillary tube 2021 is preferably made of SP-1, PEI, PTFE, and other clean insulation materials. In the design of the structure of the capillary tube 2021, an air inlet space in the middle of the edge insulated air inlet portion 202 is compressed to prevent the radio frequency from forming an enough space between the center radio frequency air inlet portion 203 and the center air inlet joint portion 201 to allow sufficient electron movement for ignition.

Embodiment 6

Figure 9:
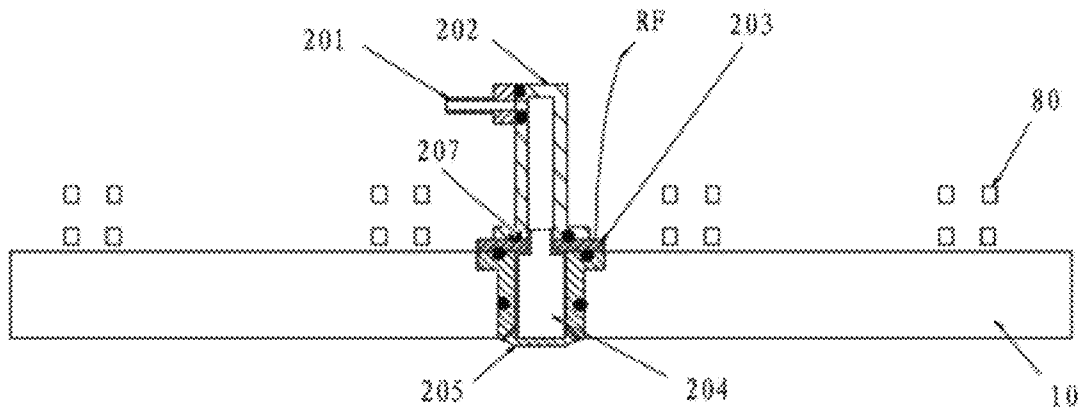
FIG. 9 is a schematic structural diagram of a radio frequency cleaning mechanism according to Embodiment 6 of the present invention.

As shown in FIG. 9, in this embodiment, the center air inlet joint portion 201 is perpendicular to the edge insulated air inlet portion 202, and the edge insulated air inlet portion 202, the center radio frequency air inlet portion 203, the center insulated air inlet portion 204, and the top ceramic air inlet portion 205 are coaxial. A length of the edge insulated air inlet portion 202 is greater than or equal to 5 mm. A radial width of a part that is of the center insulated air inlet portion 204 at a top end thereof and that extends into the air inlet passage of the center radio frequency air inlet portion 203 is consistent with a tube diameter of the air inlet passage of the center radio frequency air inlet portion 203.

The edge of the center radio frequency air inlet portion 203 is connected to the radio frequency (RF). The bottom of the center radio frequency air inlet portion 203 is sealed to the top ceramic air inlet portion 205. The center radio frequency air inlet portion 203 is preferably made of aluminum, and aluminum has favorable electrical conductivity and machining properties. The central gas passage region of the center radio frequency air inlet portion 203 and all regions in contact with the vacuum are treated with hard anodized surface treatment. This ensures that the radio frequency power can be little lost, with almost no particles generated at the same time.

In order to prevent the center radio frequency air inlet portion 203 from igniting between the bottom thereof and the top ceramic air inlet portion 205, instead of inside the chamber 1, causing structural damage to the top ceramic air inlet nozzle 11, generating a large amount of particle contamination, or even damaging the wafer 3, it is necessary to fill an excess space with the center insulated air inlet portion 204 between the bottom of the center radio frequency air inlet portion 203 and the top ceramic air inlet portion 205. The center insulated air inlet portion 204 is made of ceramic or plastic (SP-1, PEI, PTFE, and other insulation materials), with narrow gas passages 2041 uniformly distributed at the edges thereof (as shown in FIG. 12 and FIG. 13). A cross-sectional area of each of the narrow gas passages 2041 falls in a range of 0.05 $mm^2$ to 5 $mm^2$.

The center insulated air inlet portion 204 is located inside the top ceramic air inlet portion 205. The top of the center insulated air inlet portion 204 extends into an air inlet passage of the center radio frequency air inlet portion 203 with a length of the extension portion greater than or equal to 2 mm. Because the bottom of the center radio frequency air inlet portion 203 is non-equipotential with the gas below, there is no possibility of ignition. In addition, because the bottom of the center radio frequency air inlet portion 203 is non-equipotential with the gas below, as designed in this structure, a bottom space of the center radio frequency air inlet portion 203 is compressed to prevent radio frequency from forming an enough space at the bottom of the center radio frequency air inlet portion 203 to allow sufficient electron movement for ignition.

Because the center radio frequency air inlet portion 203 is connected to the radio frequency, the center air inlet joint portion 201 is grounded. In order to prevent ignition between the center radio frequency air inlet portion 203 and the center air inlet joint portion 201, it is necessary to add the edge insulated air inlet portion 202 between the two, and the edge insulated air inlet portion 202 is preferably made of ceramic, SP-1, PTFE, or other clean insulation materials. In the design, no particles are generated, and insulation is achieved without air intake. In addition, in order to prevent ignition inside the edge insulated air inlet portion 202 during the etching process, a plurality of capillary tubes 2021 need to be provided in the central gas passage of the edge insulated air inlet portion 202. The plurality of capillary tubes 2021 communicate with the central air inlet passage of the center radio frequency air inlet portion 203. A cross-sectional area of each of the capillary tubes 2021 falls in a range of 0.05 $mm^2$ to 3 $mm^2$. The capillary tube 2021 is preferably made of SP-1, PEI, PTFE, and other clean insulation materials. In the design of the structure of the capillary tube 2021, an air inlet space in the middle of the edge insulated air inlet portion 202 is compressed to prevent the radio frequency from forming an enough space between the center radio frequency air inlet portion 203 and the center air inlet joint portion 201 to allow sufficient electron movement for ignition.

In Embodiment 4 and Embodiment 6, because the region connected to the radio frequency covers the lower surface of the top ceramic air inlet portion 205, during the cleaning method, the radio frequency is connected to the center radio frequency air inlet portion 203, thus generating strong bias pressure on the lower surface of the top ceramic air inlet portion 205, allowing plasma to directly bombard the lower surface of the top ceramic air inlet portion 205, thereby completely cleaning the lower surface of the top ceramic air inlet portion 205.

Embodiment 7

Figure 10:
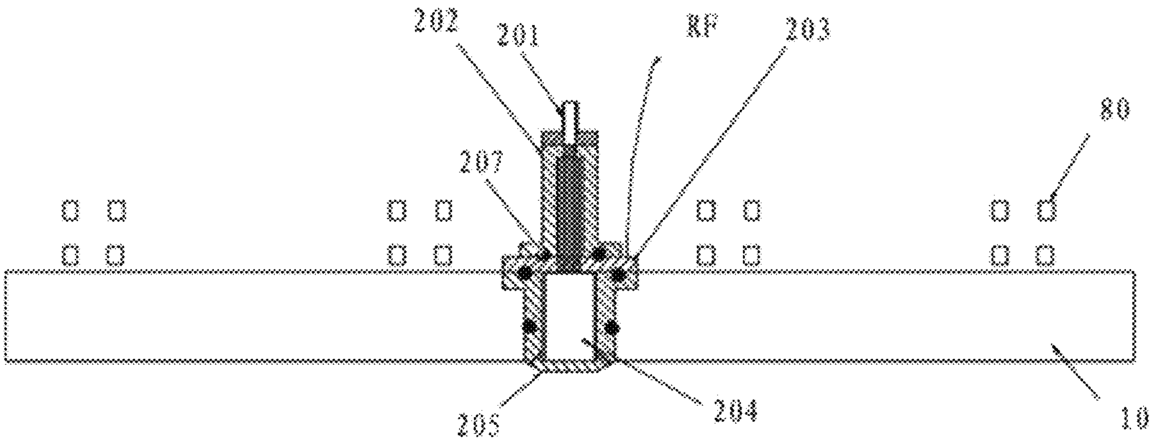
FIG. 10 is a schematic structural diagram of a radio frequency cleaning mechanism according to Embodiment 7 of the present invention.
Figure 11:
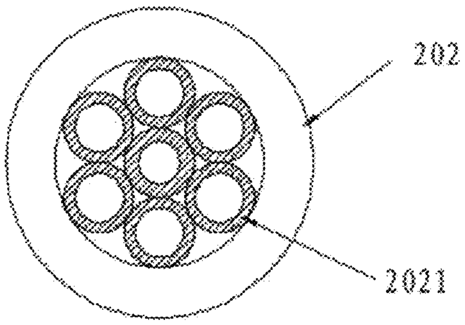
FIG. 11 is a cross-sectional view of an edge insulated air inlet portion according to the present invention.

As shown in FIG. 10, in this embodiment, the plurality of capillary tubes 2021 provided in the middle of the edge insulated air inlet portion 202 extend to the bottom of the center radio frequency air inlet portion 203, and the center air inlet joint portion 201, the edge insulated air inlet portion 202, the center radio frequency air inlet portion 203, the center insulated air inlet portion 204, and the top ceramic air inlet portion 205 are coaxial. A length of the edge insulated air inlet portion 202 is greater than or equal to 5 mm. A non-extended part of the top of the center insulated air inlet portion 204 reaches the air inlet passage of the center radio frequency air inlet portion 203.

The edge of the center radio frequency air inlet portion 203 is connected to the radio frequency (RF). The bottom of the center radio frequency air inlet portion 203 is sealed to the top ceramic air inlet portion 205. The center radio frequency air inlet portion 203 is preferably made of aluminum, and aluminum has favorable electrical conductivity and machining properties. The central gas passage region of the center radio frequency air inlet portion 203 and all regions in contact with the vacuum are treated with hard anodized surface treatment. This ensures that the radio frequency power can be little lost, with almost no particles generated at the same time.

In order to prevent the center radio frequency air inlet portion 203 from igniting between the bottom thereof and the top ceramic air inlet portion 205, instead of inside the chamber 1, causing structural damage to the top ceramic air inlet nozzle 11, generating a large amount of particle contamination, or even damaging the wafer 3, it is necessary to fill an excess space with the center insulated air inlet portion 204 between the bottom of the center radio frequency air inlet portion 203 and the top ceramic air inlet portion 205. The center insulated air inlet portion 204 is made of ceramic or plastic (SP-1, PEI, PTFE, and other clean insulation materials), with narrow gas passages 2041 uniformly distributed at the edges thereof (as shown in FIG. 12 and FIG. 13). A cross-sectional area of each of the narrow gas passages 2041 falls in a range of 0.05 $mm^2$ to 5 $mm^2$. Because the bottom of the center radio frequency air inlet portion 203 is non-equipotential with the gas below, as designed in this structure, a bottom space of the center radio frequency air inlet portion 203 is compressed to prevent radio frequency from forming an enough space at the bottom of the center radio frequency air inlet portion 203 to allow sufficient electron movement for ignition.

Because the center radio frequency air inlet portion 203 is connected to the radio frequency, the center air inlet joint portion 201 is grounded. In order to prevent ignition between the center radio frequency air inlet portion 203 and the center air inlet joint portion 201, it is necessary to add the edge insulated air inlet portion 202 between the two, and the edge insulated air inlet portion 202 is preferably made of ceramic, SP-1, or PEI. In the design, no particles are generated, and insulation is achieved without air intake. In addition, in order to prevent ignition inside the edge insulated air inlet portion 202 during the etching process, a plurality of capillary tubes 2021 need to be provided in the central gas passage of the edge insulated air inlet portion 202. The plurality of capillary tubes 2021 communicate with the central air inlet passage of the center radio frequency air inlet portion 203. A cross-sectional area of each of the capillary tubes 2021 falls in a range of 0.05 $mm^2$ to 3 $mm^2$. The capillary tube 2021 is preferably made of SP-1, PEI, PTFE, and other clean insulation materials. In the design of the structure of the capillary tube 2021, an air inlet space in the middle of the edge insulated air inlet portion 202 is compressed to prevent the radio frequency from forming an enough space between the center radio frequency air inlet portion 203 and the center air inlet joint portion 201 to allow sufficient electron movement for ignition. This embodiment further expands an area that is of the lower surface of the top ceramic air inlet portion 205 and that is connected to the radio frequency access, such that the top ceramic air inlet nozzle 11 has no dead corners during cleaning, thereby completely cleaning the top ceramic air inlet nozzle 11.

In Embodiment 4 and Embodiment 7, a sealing ring 207 is provided between the center air inlet joint portion 201 and the edge insulated air inlet portion 202, a sealing ring 207 is provided between the center radio frequency air inlet portion 203 and the top ceramic air inlet portion 205, and a sealing ring 207 is provided at a lower end of the top ceramic air inlet portion 205. The sealing rings 207 are used to seal and tightly connect the structures.

Embodiment 4 to Embodiment 7 of the present invention can all be used in combination with the plasma processing system and cleaning method involved in any one of Embodiment 1 to Embodiment 3. The plasma processing system, the cleaning method, and the radio frequency cleaning mechanism involved in the present invention effectively resolve the problem that the lower surface of the top ceramic air inlet nozzle 11 cannot be cleaned during cleaning of the chamber 1, avoiding the loss of the top ceramic air inlet nozzle 11 and the wafer 3.

Those skilled in the art can understand that, unless otherwise defined, all terms (including technical terms and scientific terms) used herein have the same meanings as commonly understood by those of ordinary skill in the art to which this application belongs. It should also be understood that terms such as those defined in a general dictionary should be understood to have a meaning consistent with the meaning in the context of the prior art, and unless defined as herein, such terms will not be interpreted in an ideal or overly formal sense.

The meaning of "and/or" mentioned in this application means both when each exists alone and when both exist simultaneously are included.

The meaning of "connection" in this application can be a direct connection between components or an indirect connection between components through other components.

The foregoing ideal embodiments according to the present invention are used as enlightenment, and based on the foregoing descriptive content, persons related in the art can absolutely make various changes and modifications without departing from the scope of the technical concept of the present invention. The technical scope of the present invention is not limited to the content in this specification, and the technical scope of the present invention should be subject to the claims.

What is claimed is:

1. A ceramic air inlet radio frequency connection type cleaning device, comprising a coupling window provided on a top of a chamber, a top ceramic air inlet nozzle located in a central region of the coupling window, and a three-dimensional coil placed above the coupling window, wherein the three-dimensional coil comprises two single three-dimensional coil bodies which are independent mutually at center and edge, and the two single three-dimensional coil bodies each have one end connected together to radio frequency and another end connected together and grounded; and comprising a power supply control device and a radio frequency cleaning mechanism, wherein:

the power supply control device comprises a power distribution box and is used for power supply switching;

the two single three-dimensional coil bodies of the three-dimensional coil are in connection with two circuits of the power distribution box, respectively, so as to perform etching of a wafer in the chamber; and a negative pressure is generated by connecting the radio frequency to the radio frequency cleaning mechanism, such that plasma directly bombards a lower surface of the top ceramic air inlet nozzle to perform cleaning of the lower surface of the top ceramic air inlet nozzle, wherein the radio frequency cleaning mechanism comprises a center air inlet joint portion, an edge insulated air inlet portion, a center radio frequency air inlet portion and the top ceramic air inlet nozzle connected in sequence, wherein the top ceramic air inlet nozzle comprises a center insulated air inlet portion and a top ceramic air inlet portion, the center insulated air inlet portion is located inside the top ceramic air inlet portion, and a top of the center insulated air inlet portion extends into an air inlet passage of the center radio frequency air inlet portion, the center air inlet joint portion, the edge insulated air inlet portion, and the center radio frequency air inlet portion each have a communicating central gas passage;

the center air inlet joint portion is grounded and passable for a cleaning gas, and the center radio frequency air inlet portion is connected to the radio frequency;

the radio frequency cleaning mechanism comprises a plurality of capillary tubes and a plurality of narrow gas passages, the plurality of capillary tubes are provided in the central gas passage of the edge insulated air inlet portion, the plurality of narrow gas passages are uniformly distributed on an edge of the center insulated air inlet portion and communicate with the central air inlet passage of the center radio frequency air inlet portion; and wherein:

the power supply control device comprises a first radio frequency power supply, a radio frequency matcher, and a first radio frequency switching box connected in sequence, and switching between the etching of the wafer and the radio frequency cleaning mechanism is achieved by means of the RF switching box; or the power supply control device comprises a second radio frequency power supply, a second radio frequency switching box, a first coil radio frequency matcher, and a first center radio frequency matcher connected to the radio frequency cleaning mechanism, wherein an output terminal of the second radio frequency power supply is connected to the second radio frequency switching box, and switching between the first coil radio frequency matcher and the first center radio frequency matcher is achieved by means of the second radio frequency switching box; or the power supply control device comprises a coil radio frequency power supply, a center radio frequency power supply, a second coil radio frequency matcher, and a second center radio frequency matcher, wherein an output terminal of the coil radio frequency power supply is connected to the second coil radio frequency matcher, an output terminal the center radio frequency power supply is connected to the second center radio frequency matcher, and an output terminal of the second center radio frequency matcher is connected to the radio frequency cleaning mechanism.

2. The ceramic air inlet radio frequency connection type cleaning device according to claim 1, wherein a length of the edge insulated air inlet portion is greater than or equal to 5 mm; and a cross-sectional area of each capillary tubes and each narrow gas passage is 0.05 $mm^2$ to 5 $mm^2$; and the top of the center insulated air inlet portion extends into the air inlet passage of the center radio frequency air inlet portion with an extension length greater than or equal to 2 mm.

3. The ceramic air inlet radio frequency connection type cleaning device according to claim 1, wherein the center air inlet joint portion and the edge insulated air inlet portion are coaxial, the center radio frequency air inlet portion, the center insulated air inlet portion, and the top ceramic air inlet portion are coaxial, and the edge insulated air inlet portion is perpendicular to the center radio frequency air inlet portion.

4. The ceramic air inlet radio frequency connection type cleaning device according to claim 3, further comprising an adjustment member, wherein the adjustment member is of a ring structure and provided between the center insulated air inlet portion and the top ceramic air inlet portion, and a radial width of a part that is of the center insulated air inlet portion at a top end thereof and that extends into the air inlet passage of the center radio frequency air inlet portion is smaller than a tube diameter of the air inlet passage of the center radio frequency air inlet portion.

5. The ceramic air inlet radio frequency connection type cleaning device according to claim 3, further comprising sealing rings, wherein the sealing rings are provided between the center air inlet joint portion and the edge insulated air inlet portion, between the center radio frequency air inlet portion and the top ceramic air inlet portion, and at a lower end of the top ceramic air inlet portion.

6. The ceramic air inlet radio frequency connection type cleaning device according to claim 1, wherein the center air inlet joint portion is perpendicular to the edge insulated air inlet portion, and the edge insulated air inlet portion, the center radio frequency air inlet portion, the center insulated air inlet portion, and the top ceramic air inlet portion are coaxial.

7. The ceramic air inlet radio frequency connection type cleaning device according to claim 1, wherein the plurality of capillary tubes provided in the central air inlet passage of the edge insulated air inlet portion extend to a bottom of the center radio frequency air inlet portion, and the center air inlet joint portion, the edge insulated air inlet portion, the center radio frequency air inlet portion, the center insulated air inlet portion, and the top ceramic air inlet portion are coaxial.

* * * * *